(12) United States Patent
Kinoshita et al.

(10) Patent No.: US 7,312,669 B2
(45) Date of Patent: Dec. 25, 2007

(54) OSCILLATION CIRCUIT

(75) Inventors: Masaki Kinoshita, Ota (JP); Takashi Kamimura, Setagaya-ku (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 72 days.

(21) Appl. No.: 11/443,369

(22) Filed: May 31, 2006

(65) Prior Publication Data
US 2006/0267700 A1 Nov. 30, 2006

(30) Foreign Application Priority Data
May 31, 2005 (JP) ............................. 2005-160240

(51) Int. Cl.
*H03B 27/00* (2006.01)
(52) U.S. Cl. ..................... 331/57; 331/74; 331/12; 455/258; 455/260; 455/318
(58) Field of Classification Search ............... 331/57, 331/74, 12; 455/260, 258, 318
See application file for complete search history.

(56) References Cited

U.S. PATENT DOCUMENTS 5,180,994 A 1/1993 Martin et al.

6,980,787 B1* 12/2005 Dujmenovic ................ 455/318

* cited by examiner

*Primary Examiner*—Arnold Kinkead
(74) *Attorney, Agent, or Firm*—Oliff & Berridge, PLC

(57) ABSTRACT

An oscillation circuit for generating two oscillation signals having a phase difference of 90° by using an LC oscillator has a disadvantage for integration. Therefore, a differential type ring oscillator comprising interpolation type delay circuits of four stages is used as an original oscillator without using any LC oscillator. The oscillation frequency of the original oscillator is set to f/2. Intermediate signals S(k) having a phase difference of 45(k-1)° with respect to a reference phase are obtained as the outputs of the respective stages of the original oscillator. A multiplying circuit 22 generates the product signal of S(2) and S(4) in mixers. This product signal is vibrated at cos (ft/2), and the output signal $V_{out1}$ is generated on the basis of the product signal. A multiplying circuit generates the product signal of S(1) and S(3) in mixers. This product signal is vibrated at cos(ft/2+ π/2), and the output signal $V_{out2}$ is generated on the basis of the product signal. $V_{out1}$, $V_{out2}$ are output as the oscillation signals having the frequency f and the phase difference of 90°.

6 Claims, 4 Drawing Sheets (related art)

OSCILLATION CIRCUIT

CROSS-REFERENCE TO RELATED APPLICATIONS

The priority application number JP2005-160240 upon which this patent application is based is hereby incorporated by reference.

BACKGROUND OF THE INVENTION

The present invention relates to an oscillation circuit for generating two output signals having a phase difference of 90°.

Normally, a receiver converts a received signal of a radio frequency to a predetermined intermediate frequency $f_{IF}$ by using a local signal generated by a local oscillator. For example, when a broadcast station A of a frequency $f_A$ is received, the local oscillator generates a local signal of a frequency $f_{LO}$ satisfying the relationship that $(f_A-f_{LO})$ is equal to $f_{IF}$. Here, the local signal converts, to an intermediate frequency $f_{IF}$, a received signal of a frequency $f_B$ satisfying the relationship that $(f_{LO}-f_B)$ is equal to $f_{IF}$. Therefore, when a signal of another broadcast station B is located at the position corresponding to the frequency $f_B$, a phenomenon occurs where the broadcast station B is also received while superposed on the broadcast station A. The reception of the broadcast station B as described above is called image reception.

Furthermore, there also exists a direct conversion system of mixing a received signal of a radio frequency with a local signal having the same frequency as the received signal concerned and directly converting the signals to a low frequency signal corresponding to the human auditory range. According to this system, the intermediate frequency is not required, and thus the circuit construction is simple.

In order to construct an image rejection mixer for removing the image described above, local signals having a phase difference of π/2 [rad], that is, 90° therebetween are required. Furthermore, when the direct conversion is carried out by using a mixer for demodulating an I/Q composite signal, local signals having a phase difference of 90° are required.

According to a method adopted by a normal receiver, an LC oscillation signal is subjected to halved frequency division to obtain signals having a phase difference of 90°. FIG. 1 is a timing chart showing this method. On the basis of a signal SG having the frequency corresponding to the LC oscillator signal, a halved frequency division circuit generates a signal SG2 whose state is inverted at the rising edge of the signal SG and also a signal SG2' whose state is inverted at the falling edge of the signal SG. As described above, the signals SG2 and SG2' having a phase difference of 90° are obtained.

According to this method, the frequency which is twice as high as a desired frequency is generated in the LC oscillator. Here, when the oscillation frequency of the oscillator is set to the same as the local signal, the frequency of the local signal fluctuates with an input signal having a high intensity, so that it is difficult to carry out direct conversion. The direct conversion is favorable as the method of generating the double frequency described above because this problem does not occur.

According to another conventional method of achieving signals having a phase difference of 90°, phase shifting is carried out for the LC oscillator signal by using RC filters. In this method, a high pass filter (HPF) and a low pass filter (LPF) are constructed by RC filters. In the case of the HPF, the phase of an output signal advances from the input signal of the cut-off frequency by 45°. Conversely, in the case of the LPF, the phase of the output signal is delayed from the input signal by 45°. Therefore, the LC oscillator signal is input to the HPF and LPF in which the cut-off frequency is set to the frequency of the LC oscillator signal, whereby two signals having a phase difference of 90° are obtained as the output signals of both the filters.

The construction of subjecting the LC oscillator signal described above to halved frequency division is suitable for direct conversion. In addition, the oscillation frequency can be varied by constructing a capacitor constituting the LC oscillator with a variable condenser or the like, and thus signals having a phase difference of 90° can be obtained across a broad band. However, the LC oscillator has a problem that it is not suitably constructed as a semiconductor integrated circuit. Particularly, in order to carry out reception based on broadband such as television or the like, plural LC oscillators are required, and it is difficult to install them into an LSI chip.

Furthermore, the construction using the RC filter as described above has a disadvantage that the frequencies of the signals having a phase difference of 90° are restricted by the cut-off frequency of the RC filter and thus it is limited to a narrow band. Furthermore, the oscillation frequency of the LC oscillator is coincident with the reception frequency in the above-described construction, and thus there is a problem that this construction is not suitable for the direct conversion. Furthermore, there is also a problem that this construction is not suitable for integration.

SUMMARY OF THE INVENTION

The present invention has an object to provide an oscillation circuit that is easily integrated and suitable for direct conversion and can also obtain signals having a phase difference of 90° over a broad band.

An oscillation circuit of the present invention generates a first output signal and a second output signal as two signals having a frequency f that are different in phase from each other by π/2 [rad]. The oscillation circuit of the present invention comprises an original oscillator that is a ring oscillator oscillating at a frequency f/n (n represents an integer of 2 or more) and output intermediate signals S(k) (k represents an integer satisfying $1 \leq k \leq 4n$) of 4n each having a phase difference of $(k-1)\pi/2n$ [rad] from a reference phase from nodes of 4n provided to an oscillation loop, a first multiplying portion for generating a first mixed signal corresponding to the product of the intermediate signals S $(k_{1j})$ of n (j represents an integer satisfying $1 \leq j \leq n$, and each $k_{1j}$ represents any integer from 1 to 4n) and generating the first output signal on the basis of the first mixed signal, and a second multiplying portion for generating a second mixed signal corresponding to the product of the intermediate signals S $(k_{2j})$ of n for $k_{2j}$ satisfying the following equation and generating the second output signal on the basis of the second mixed signal:

$$\sum_{j=1}^{n} k_{2j} = \sum_{j=1}^{n} k_{1j} + n$$

DETAILED DESCRIPTION OF THE PREFERRED EMBODIMENTS

Preferred embodiments according to the present invention will be described hereunder with reference to the accompanying drawings.

Basic Construction

Figure 1:
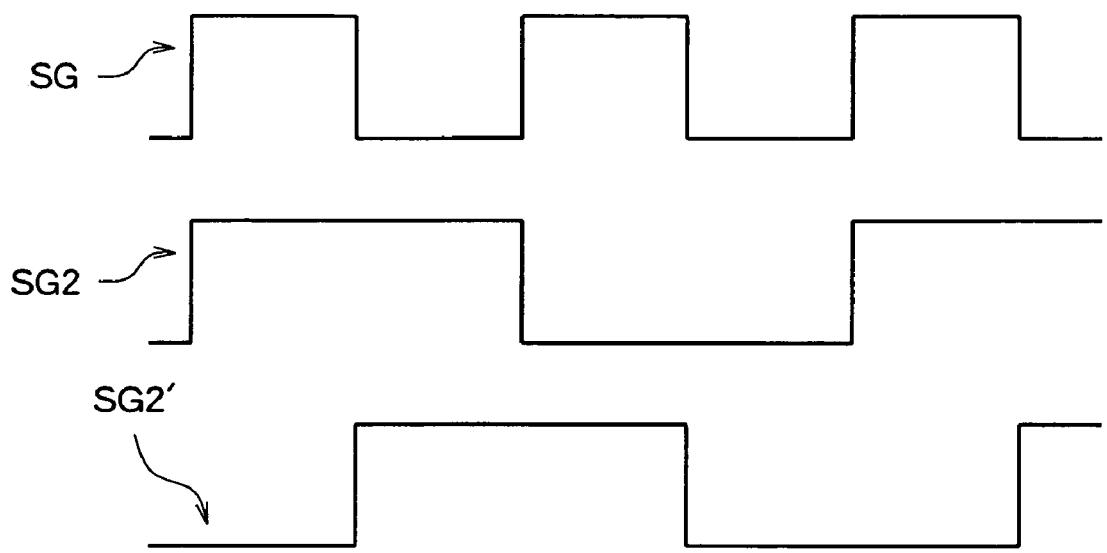
FIG. 1 is a timing chart showing a method of achieving signals having a phase difference of 90° by subjecting an LC oscillator signal to halved frequency division.
Figure 2:
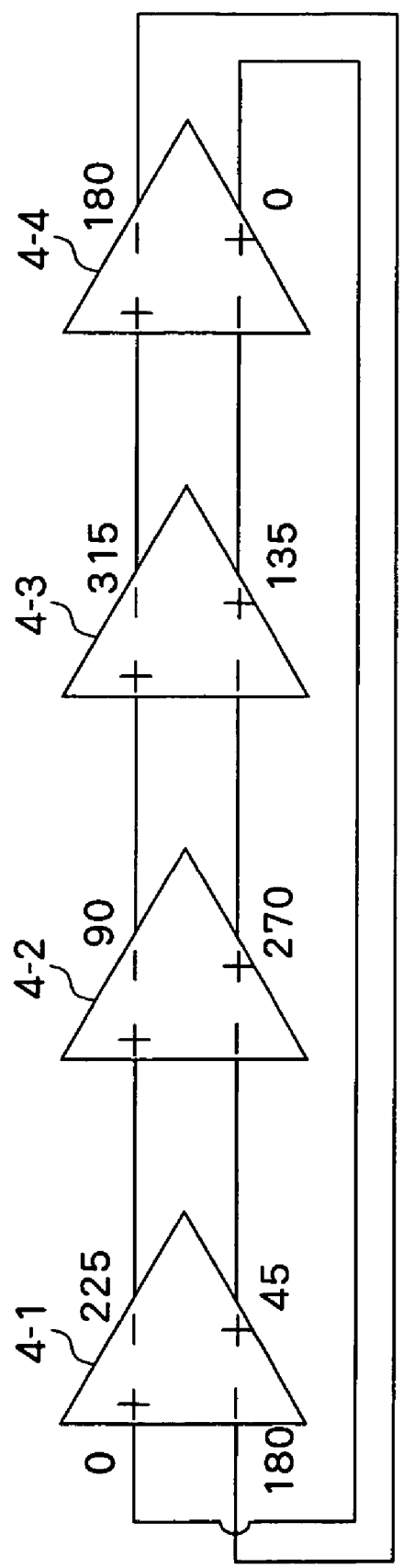
FIG. 2 is a diagram showing a voltage controlled oscillation circuit according to the present invention.

FIG. 2 is a diagram showing a voltage controlled oscillation circuit providing a basis for the present invention.

The voltage controlled oscillation circuit is a differential type ring oscillator obtained by connecting interpolation type delay circuits 4 of four stages. The interpolation type delay circuit 4 is a differential type inversion amplifier. When a ring oscillator is constructed by interpolation type delay circuits 4 of even-number stages as shown in FIG. 2, the differential output at the preceding stage and the differential input at the next stage are connected to each other so that the phase is not inverted at one of the mutual connections of the interpolation type delay circuits 4 and the phase is inverted at the other mutual connections. In the construction of FIG. 2, the interpolation type delay circuit 4-4 at the fourth stage and the interpolation type delay circuit 4-1 at the first stage are connected to each other so that the phase is not inverted therebetween.

The phase δ of the output signal at each stage when the phase of the input signal to the non-inverting input terminal of the interpolation type delay circuit 4-1 is set as a reference phase is shown in FIG. 2. Specifically, the phases δ at the non-inverting output terminal (positive output terminal) and the inverting output terminal (negative output terminal) of the interpolation type delay circuit 4-1 are set to 45° and 225° respectively, and the phases δ at the positive output terminal and the negative output terminal of the subsequent interpolation type delay circuit 4-2 are set to 270° and 90°. Furthermore, the phases δ at the positive output terminal and the negative output terminal of the interpolation type delay circuit 4-3 are set to 135° and 315° respectively, and the phases δ at the positive output terminal and the negative output terminal of the subsequent interpolation type delay circuit 4-4 are set to 0° and 180°.

As described above, the phases of the output signals of the interpolation type delay circuits 4 are displaced from one another every 45°, and thus eight phase values are obtained. Therefore, the output signals which are different in phase from one another by 90° are taken out from all the output signals as a local signal, and used in a receiving circuit. However, when direction conversion is carried out by using the local signal, the oscillation frequency of the ring oscillator and the frequency of the local signal are coincident with each other, and thus the frequency of the local signal easily fluctuates with a received signal having high intensity. Therefore, the construction of one-time oscillation is not suitable for the direct conversion.

This problem can be avoided by setting the oscillation frequency of the ring oscillator to double the required frequency f of the local signal and subjecting the frequency 2f generated in the ring oscillator to halved frequency division to generate the local signals. However, it is difficult to construct the ring oscillator oscillating stably at high frequency, and thus when the frequency of the local signal is required to be high, it is difficult to use the double-oscillation construction.

EMBODIMENTS

Embodiments of the present invention (hereinafter referred to as embodiments) will be described with reference to the drawings.

Figure 3:
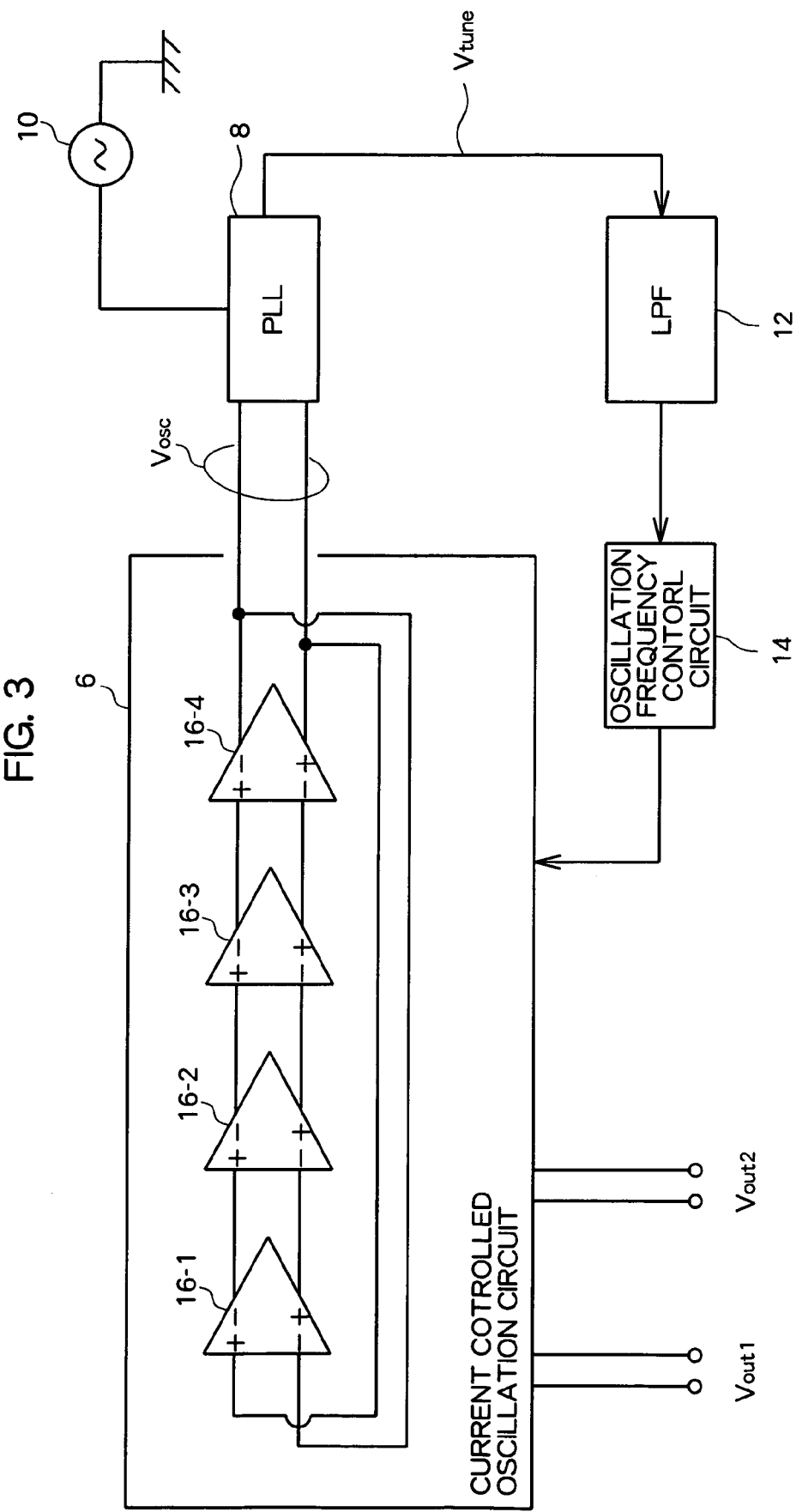
FIG. 3 is a block diagram showing an oscillation circuit of an embodiment of the present invention.

FIG. 3 is a block diagram showing an oscillation circuit according to the present invention. This oscillation circuit comprises a current controlled oscillation circuit 6, a phase locked circuit (PLL: Phase Locked Loop) 8, a reference signal source 10, a low pass filter (LPF) 12, and an oscillation frequency control circuit 14. For example, it outputs output signals $V_{out1}$, $V_{out2}$ used as local signals in the receiving circuit, etc., the output signals having a frequency f and being different in phase from each other by 90°.

The current controlled oscillation circuit 6 contains a differential ring oscillator comprising plural differential interpolation type delay circuits 16 which are connected to one another at plural stages, and outputs the output signals $V_{out1}$, $V_{out2}$ of the oscillation circuit. The interpolation type delay circuit 16 can vary the transmission time of a signal from the input terminal thereof to the output terminal thereof in accordance with the current output from the oscillation frequency control circuit 14.

The PLL 8 generates and outputs the oscillation frequency control voltage $V_{tune}$ corresponding to the phase difference between an oscillation signal $V_{osc}$ output from the ring oscillator in the current controlled oscillation circuit 6 and a reference signal output from a reference signal source 10. $V_{tune}$ is smoothed by the LPF 12 having a predetermined time constant, and input to the oscillation frequency control circuit 14.

The oscillation frequency control circuit 14 is a differential amplifying circuit, and varies the ratio between two output currents $I_a$ and $I_b$ in accordance with the difference between $V_{tune}$ and a predetermined reference voltage $V_c$. These currents $I_a$ and $I_b$ are supplied to the interpolation type delay circuits 16 constituting the current controlled oscillation circuit 6.

Here, the interpolation type delay circuit 16 has a high speed path and a low speed path which are arranged in parallel between the differential input terminal and the differential output terminal. For example, the current $I_b$ serves as a current source of the differential amplifying circuit of the low speed path of the interpolation type delay circuit 16, and the current $I_a$ serves as a current source of the differential amplifying circuit of the high speed path of the interpolation type delay circuit 16. As $V_{tune}$ drops and thus $I_a$ increases, the signal transmission based on the high speed path out of the high speed path and the low speed path connected in parallel in the interpolation type delay circuit 16 is more predominant, and the signal transmission time is reduced, so that the phase delay of $V_{osc}$ can be eliminated. On the other hand, as $V_{tune}$ increases and thus $I_b$ increases, the signal transmission based on the low speed path is more predominant, and the signal transmission time is increased, so that the phase advance of $V_{osc}$ can be eliminated.

In this oscillation circuit, the frequency of the reference signal source 10 is set to a value of half the frequency f of the output signals $V_{out1}$, $V_{out2}$ to be targeted, and in connection with this setting, the oscillation frequency of the ring oscillator comprising the interpolation type delay circuits 16 is controlled to f/2.

Figure 4:
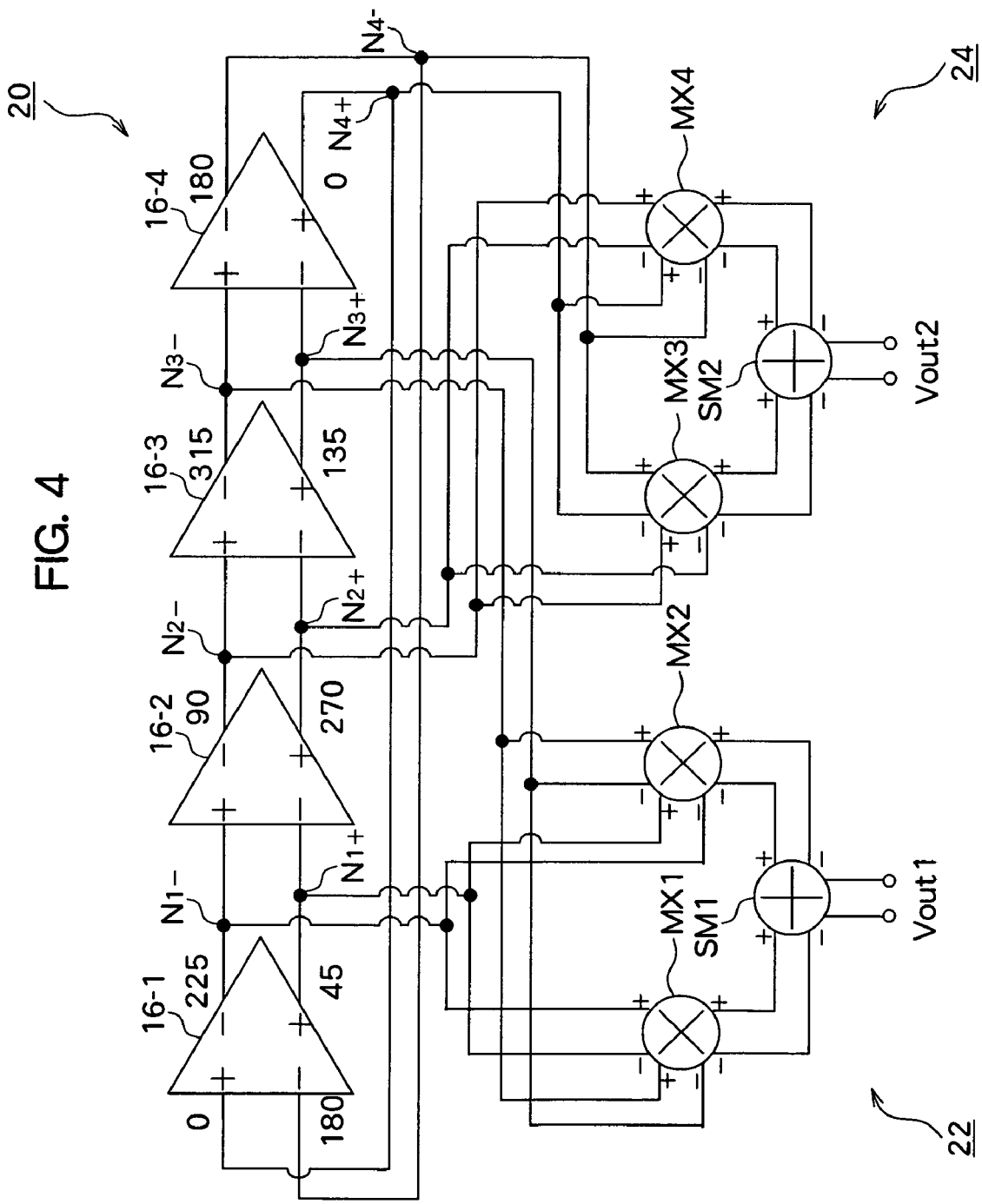
FIG. 4 is a circuit diagram showing the construction of a current controlled oscillation circuit of the embodiment.

FIG. 4 is a circuit diagram showing the construction of the current controlled oscillation circuit 6. The current controlled oscillation circuit 6 comprises an original oscillator 20 and two multiplication circuits 22 and 24.

The original oscillator 20 is a ring oscillator whose frequency is controlled to the oscillation frequency f/2. The original oscillator 20 comprises interpolation type delay circuits 16 of four stages and it has the same construction as the ring oscillator of FIG. 2 described above. The interpolation type delay circuit 16 is designed as a differential type, and intermediate signals S(k) (k represents an integer satisfying $1 \leq k \leq 8$) in an oscillation loop are taken out from the output nodes provided in connection with the eight output terminals. Here, the intermediate signal S(k) is a signal having a phase difference of $(k-1)\pi/4$ [rad], that is, $45(k-1)°$ with respect to the reference phase. In the following description, the output nodes provided in connection with the positive output terminal and negative output terminal of the interpolation type delay circuit 16 of the i-th stage are represented by $N_{i+}$, $N_{i-}$, and the signals taken out from the output nodes concerned are represented by $V_{i+}$, $V_{i-}$. For example, when the phase of the oscillation signal at the non-inverting input terminal of the interpolation type delay circuit 16-1 is set as the reference phase, S(2), S(6) are taken out from the output nodes $N_{1+}$, $N_{1-}$, S(7), S(3) are taken out from $N_{2+}$, $N_{2-}$, S(4), S(8) are taken out from $N_{3+}$, $N_{3-}$, and S(1), S(5) are taken out from $N_{4+}$, $N_{4-}$.

The multiplication circuit 22 comprises two mixers MX1, MX2 each of which generates the signal corresponding to the product between the differential output of the interpolation type delay circuit 16-1 and the differential output of the interpolation type delay circuit 16-3, and an adder SM1 for adding and combining the outputs of MX1, MX2 and outputting $V_{out1}$. Furthermore, the multiplication circuit 24 comprises two mixers MX3 and MX4 each of which generates the signal corresponding to the product between the differential output of the interpolation type delay circuit 16-2 and the differential output of the interpolation type delay circuit 16-4, and an adder SM2 for adding and combining the outputs of MX3 and MX4 and outputting $V_{out2}$.

Each of the mixers MX1 to MX4 is a Double Balanced Mixer for generating one differential output in accordance with two differential inputs, for example, and specifically it may be constructed by a Gilbert mixer. This mixer has a terminal (first input terminal) to which an input signal is input, and a terminal (second input terminal) to which a switch signal is input, and outputs the product of the inputs concerned. The first input terminal and the second input terminal are asymmetrical with each other in the circuit construction, and loads imposed on the input signals to the first and second input terminals are different from each other. Therefore, each of the multiplication circuits 22 and 24 is equipped with two mixers, and the output node of the intermediate signal and the input terminal of the mixer are connected to each other so that the two inputs to one mixer are opposite to the two inputs to the other mixer. Accordingly, the loads on the respective stages of the interpolation type delay circuits 16 are equalized to one another, as a result of which the variation amounts in the phase δ at the respective stages are equalized to one another.

Specifically, in the multiplication circuit 22, the differential signal $(V_{1+}-V_{1-})$ is input to the first input terminal of MX1 and the second input terminal of MX2, and the differential signal $(V_{3+}-V_{3-})$ is input to the second input terminal of MX1 and the first input terminal of MX2.

Here, any one of the two differential signals $(V_{1+}-V_{1-})$ and $(V_{3+}-V_{3-})$ is input to any one of MX1 and MX2 while the polarity thereof is inverted. For example, in the construction shown in FIG. 4, $(V_{1+}-V_{1-})$ is input to the first input terminal of MX1 and the second input terminal of MX2 while the polarity thereof is opposite between MX1 and MX2. Therefore, the output signal of MX1 and the output signal of MX2 correspond to signals having a relationship that the polarities thereof are opposite to each other. These two output signals are set as differential inputs to the adder SM1. At this time, one of the two output signals is inverted and then input to the adder SM1, and SM1 outputs the signal $V_{out1}$ corresponding to $2(V_{1+}-V_{1-})(V_{3+}-V_{3-})$. According to this construction, it is expected that DC offset components occurring in the output signals of MX1, MX2 are canceled each other and thus reduced in the output of SM1.

The construction of the multiplication circuit 24 is basically the same as the multiplication circuit 22. Describing in detail, in the multiplication circuit 24, the differential signal $(V_{4+}-V_{4-})$ is input to the first input terminal of MX3 and the second input terminal of MX4, and the differential signal $(V_{2+}-V_{2-})$ is input to the second input terminal of MX3 and the first input terminal of MX4. In this case, $(V_{4+}-V_{4-})$ is input to the first input terminal of MX3 and the second input terminal of MX4 while the polarity thereof is opposite between the terminals concerned. The output signal of MX3 and the output signal of MX4 are set as the differential inputs of the adder SM2. At this time, one of the two output signals is input to the adder SM2 while the polarity thereof is inverted, and SM2 outputs the signal $V_{out2}$ corresponding to $2(V_{2+}-V_{2-})(V_{4+}-V_{4-})$.

For example, when the time is represented by t and S(1) is set to sin(ft/2), $$(V_{1+}-V_{1-})=2\sin(ft/2+\pi/4)$$

$$(V_{2+}-V_{2-})=2\sin(ft/2+\pi/2)$$

$$(V_{3+}-V_{3-})=2\sin(ft/2+\pi/4)$$

$$(V_{4+}-V_{4-})=2\sin(ft/2)$$

By using the product-to-sum identities of trigonometric functions, the output signal $V_{out1}$ of SM1 and the output signal $V_{out2}$ of SM2 are given by the following equations:

$$V_{out1}=-2\cos(ft/2)$$

$$V_{out2}=-2\cos(ft/2+\pi/2)$$

As described above, the signals that have the frequency f obtained by doubling the oscillating frequency f/2 of the original oscillator 20 and are different in phase from each other by 90° are output as the output signals $V_{out1}$ and $V_{out2}$ of the oscillation circuit from the current controlled oscillation circuit 6.

In the above construction, the original oscillator 20 is the ring oscillator that comprises the interpolation type delay circuits 16 of four stages and oscillates at f/2. However, even when it comprises a ring oscillator that comprises interpolation type delay circuits 16 of 2n stages (n represents an integer above 2) and oscillates at f/n, it can obtain the output signals $V_{out1}$ and $V_{out2}$ that have the frequency f and are different in phase from each other by 90°. In this case, intermediate signals S(k) of 4n that have the phase difference of (k−1)π/2n [rad] with respect to the reference phase can be taken out from the output nodes of the original oscillator 20. Of these intermediate signals, $S(k_{1j})$ of n (j represents an integer satisfying 1≦j≦n, and each $k_{1j}$ represents any integer from 1 to 4n), and the first mixied signal $V_{mx1}$ corresponding to the product of $S(k_{1j})$ is generated using the mixer. Furthermore, intermediate signals $S(k_{2j})$ of n corresponding to k2j satisfying the following equation (1) are taken out and the second mixed signal $V_{mx2}$ corresponding to the product of the intermediate signals $S(k_{2j})$ is generated by using the mixer:

$$\sum_{j=1}^{n} k_{2j} = \sum_{j=1}^{n} k_{1j} + n \quad (1)$$

$V_{mx1}$ and $V_{mx2}$ become signals that have the same frequency f and are different in phase from each other by 90°, and $V_{out1}$ and $V_{out2}$ can be obtained by using these signals. For example, in the case of n=3, $V_{mx1}$ can be generated from S(1), S(5) and S(9), and $V_{mx2}$ can be generated from S(2), S(6), S(10). Here, as described above, the construction where the loads of the respective stages of the interpolation type delay circuits 16 constituting the original oscillator 20 are equalized is suitably used. An example of this construction, a mixing circuit similar to the mixing circuit for mixing S(1), S(5), S(9) is provided to mix S(3), S(7), S(11) and generate a mixed signal $V_{mx1}'$, and a mixing circuit similar to the mixing circuit for mixing S(2), S(6), S(10) is provided to mix S(4), S(8), S(12) and generate a mixed signal $V_{mx2}'$. With respect to sine waves, $V_{mx1}' = -V_{mx1}$ $V_{mx2}' = -V_{mx2}$ Therefore, by using an adder, $(V_{mx1}-V_{mx1}')$ and $(V_{mx2}-V_{mx2}')$ are generated, and they are set as $V_{out1}$ and $V_{out2}$, respectively. With this construction, the mixing circuit is connected as a load to all the twelve intermediate signals, that is, the respective output nodes, and the phase difference can be equalized at the respective stages of the interpolation type delay circuits 16.

Any method of selecting $S(k_{1j})$ and $S(k_{2j})$ to be mixed may be used as long as the equation (1) is satisfied. For example, the construction shown in FIG. 4 is provided as one method of selecting $S(k_{ij})$ and $S(k_{2j})$ in the case of n=2. In this construction, the input signals of MX1, MX2 correspond to the difference $(V_{1+}-V_{1-})$ between $V_{1+}$ as S(2) and $V_{1-}$ as the inverted signal of S(2), and the difference $(V_{3+}-V_{3-})$ between $V_{3+}$ as S(4) and $V_{3-}$ as the inverted signal of S(4). The multiplication circuit 22 generates $V_{out1}$ substantially on the basis of the mixing of S(2) and S(4). That is, the multiplication circuit 22 generates $V_{out1}$ on the basis of the intermediate signal $S(k_{1j})$ when $k_{1j}$ is equal to even numbers of n below 2n. Likewise, the multiplication circuit 24 generates $V_{out2}$ substantially on the basis of the mixing of S(1) and S(3). That is, the multiplication circuit 24 generates $V_{out2}$ on the basis of the intermediate signal $S(k_{2j})$ when $k_{2j}$ is equal to odd numbers of n below 2n−1.

According to another method of selecting $S(k_{1j})$ and $S(k_{2j})$ in the case of n=2, both the input signals to MX1 are set to the signal corresponding to S(2), both the input signals to MX2 are set to the signal corresponding to S(4), both the input signals to MX3 are set to the signal corresponding to S(3), and both the input signals to MX4 are set to the signal corresponding to S(1). Specifically, in the circuit construction shown in FIG. 4, $V_{1+}$ as S(2) and $V_{1-}$ as the inverted signal of S(2) are input as the two differential inputs to MX1, $V_{3+}$ as S(4) and $V_{3-}$ as the inverted signal of S(4) are input as the two differential inputs to MX2, $V_{2+}$ as S(3) and $V_{2-}$ as the inverted signal of S(3) are input as the two differential inputs to MX3, and $V_{4+}$ as S(1) and $V_{4-}$ as the inverted signal of S(1) are input as the two differential inputs to MX4.

Furthermore, in the above-described construction, the original oscillator 20 is constructed by the differential type ring oscillator. However, the original oscillator 20 may be constructed by a single end type ring oscillator of 4n stages. In this case, an output node is provided in connection with the output terminal of an inverter constituting each stage, and intermediate signals S(k) of 4n are taken out.

As described above, the oscillation circuit according to the present invention generates the two first and second output signals that have the frequency f and are different in phase by only π/2 radian. The oscillation circuit of the present invention is the ring oscillator oscillating at a frequency f/n (n represents an integer of 2 or more), and comprises the original oscillator for outputting intermediate signals S(k) (k represents an integer satisfying 1≦k≦4n) of 4n each having a phase difference of (k−1)π/2n [rad] from a reference phase from nodes of 4n provided to the oscillation loop, the first multiplying portion for generating a first mixed signal corresponding to the product of the intermediate signals $S(k_{1j})$ of n (j represents an integer satisfying 1≦j≦n, and each $k_{1j}$ represents any integer from 1 to 4n) and generating the first output signal on the basis of the first mixed signal, and the second multiplying portion for generating a second mixed signal corresponding to the product of the intermediate signals $S(k_{2j})$ of n for $k_{2j}$ satisfying the following equation and generating the second output signal on the basis of the second mixed signal:

$$\sum_{j=1}^{n} k_{2j} = \sum_{j=1}^{n} k_{1j} + n$$

In the oscillation circuit of the present invention, $k_{1j}$ is equal to odd numbers of n below 2n−1, and $k_{2j}$ is equal to even numbers of n below 2n.

In the oscillation circuit of the present invention, the original oscillator is the differential ring oscillator comprising differential type inversion amplifiers of 2n stages, and the intermediate signal is an output signal of each differential type inversion amplifier.

In the oscillation circuit according to the present invention, the first multiplying portion generates the first mixed signal on the basis of the product of the differential outputs of n from the differential type inversion amplifiers of the (2j−1)-th stage, and the second multiplying portion generates the second mixed signal on the basis of the product of the differential outputs of n from the differential type inversion amplifiers of the 2j-th.

In the above-described embodiment, the oscillation circuit for n=2 is used as the oscillation circuit according to the present invention. In this oscillation circuit, the first multiplying portion has the two first mixers that have a common circuit construction equipped with the two input terminals and mixes the differential outputs from the differential type inversion amplifiers of the first and third stages, and the first adder for receiving the first mixed signals from the two first mixers and adding and combining the first mixed signals concerned to generate the first output signal. The second multiplying portion has the two second mixers that have a common circuit construction equipped with the two input terminals and mixes the differential outputs from the differential type inversion amplifiers of the second and fourth stages, and the second adder for receiving the second mixed signals from the two second mixers and adding and combining the second mixture signals concerned to generate the second output signal. The differential outputs of the differential type of inversion amplifiers of the first and third stages are input to the opposite input terminals of the two first mixers. The differential outputs of the differential type inversion amplifiers of the second and fourth stages are input to the opposite input terminals of the two second mixers.

In the oscillation circuit of the present invention for n=2, any one differential output of the differential type inversion amplifier of the first or third stage is input to any one of the two first mixers while the polarity thereof is inverted, and any one differential output of the differential type inversion amplifier of the second or fourth stage is input to any one of the two second mixers while the polarity thereof is inverted. In this construction, the first mixed signal of any one of the two first mixers is input to the first adder while the polarity thereof is inverted, and the second mixed signal of any one of the two second mixers is input to the second adder while the polarity thereof is inverted.

As described above, according to the present invention, the original oscillator oscillates at a frequency of 1/n of a target output frequency f. The intermediate signals of n are taken out from the nodes of 4n provided in the oscillation loop of the ring oscillator constituting the original oscillator, and mixed with one another to obtain the mixed signal of the frequency f which corresponds to the n-multiplication signal. The intermediate signals are displaced in phase at an equal interval between the respective nodes, and the two output signals having the phase difference of 90° can be obtained in accordance with the combination of the intermediate signals to be mixed. According to the present invention, the output frequency f and the frequency of the original oscillator are different from each other, and thus when a direct conversion receiving circuit in which the output of the oscillation circuit is used as a local signal is constructed, the frequency of the local signal can be prevented from fluctuating with the input signal having high intensity. That is, the oscillation circuit of the present invention is suitable for the direct conversion. Furthermore, even when the output frequency f is high, the oscillation frequency of the ring oscillator may be set to be lower than the output frequency f, and thus the construction of the oscillator is easy. By varying the oscillation frequency of the ring oscillator, the oscillation frequency f varies while the phase difference of the two output signals of the oscillation circuit is kept to 90°. That is, the output signal of the phase difference of 90° can be obtained over a broad band. Furthermore, a ring oscillator which can be easily integrated is used as the original oscillator without using an LC oscillator which is difficult to be integrated, and thus the oscillation circuit of this embodiment can be easily integrated.

What is claimed is:

1. An oscillation circuit for generating a first output signal and a second output signal that have a frequency f and are different in phase from each other by π/2 radian, comprising:

an original oscillator that is a ring oscillator oscillating at a frequency f/n (n represents an integer of 2 or more), and output intermediate signals $S(k)$ (k represents an integer satisfying $1 \leq k \leq 4n$) of 4n each having a phase difference of $(k-1)\pi/2n$ [rad] from a reference phase from nodes of 4n provided in an oscillation loop;

a first multiplying portion for generating a first mixed signal corresponding to the product of the intermediate signals $S(k_{1j})$ of n (j represents an integer satisfying $1 \leq j \leq n$, and each $k_{1j}$ represents any integer from 1 to 4n) and generating the first output signal on the basis of the first mixed signal; and a second multiplying portion for generating a second mixed signal corresponding to the product of the intermediate signals $S(k_{2j})$ of n for $k_{2j}$ satisfying the following equation and generating the second output signal on the basis of the second mixed signal:

$$\sum_{j=1}^{n} k_{2j} = \sum_{j=1}^{n} k_{1j} + n.$$

2. The oscillation circuit according to claim 1, wherein $k_{1j}$ is odd numbers of n below 2n−1, and $k_{2j}$ is even numbers of n below 2n.

3. The oscillation circuit according to claim 1, wherein the original oscillator is a differential type ring oscillator comprising differential type inversion amplifiers of 2n stages, and the intermediate signal is an output signal of each differential type inversion amplifier.

4. The oscillation circuit according to claim 3, wherein the first multiplying portion generates the first mixture signal on the basis of the product of the differential outputs of n from the differential type inversion amplifiers of the (2j−1)-th stage, and the second multiplying portion generates the second mixture signal on the basis of the product of the differential outputs of n from the differential type inversion amplifiers of the 2j-th stage.

5. The oscillation circuit according to claim 4, wherein n is equal to 2, the first multiplying portion comprises two first mixers that have a common circuit construction equipped with two input terminals and mix the differential outputs from the differential type inversion amplifiers of the first and third stages, and a first adder for receiving the first mixed signals from the two first mixers and adding and combining the first mixed signals to generate and output the first output signal, the second multiplication comprises two second mixers that have a common circuit construction equipped with two input terminals and mix the differential outputs from the differential type inversion amplifiers of the second and fourth stages, and a second adder for receiving the second mixed signals from the two second mixers and adding and combining the second mixed signals to generate and output the second output signal, the differential outputs of the differential type inversion amplifier of the first and third stages are input to the opposite input terminals of the two first mixers, and the differential outputs of the differential type inversion amplifiers of the second and fourth stages are input to the opposite input terminals of the two second mixers.

6. The oscillation circuit according to claim 5, wherein any one differential output of the differential type inversion amplifier of the first or third stage is input to any one of the two first mixers while the polarity thereof is inverted, any one differential output of the differential type inversion amplifier of the second or fourth stage is input to any one of the two second mixers while the polarity thereof is inverted, any one first mixed signal of the two first mixers is input to the first adder while the polarity thereof is inverted, and any one second mixed signal of the two second mixers is input to the second adder while the polarity thereof is inverted.

* * * * *